(12) United States Patent
Grodzki et al.

(10) Patent No.: US 9,989,612 B2
(45) Date of Patent: Jun. 5, 2018

(54) QUIET MAGNETIC RESONANCE ANGIOGRAPHIC IMAGING

(71) Applicant: Siemens Aktiengesellschaft, Munich (DE)

(72) Inventors: David Grodzki, Erlangen (DE); Peter Schmitt, Weisendorf (DE)

(73) Assignee: Siemens Aktiengesellschaft, Munich (DE)

( * ) Notice: Subject to any disclaimer, the term of this patent is extended or adjusted under 35 U.S.C. 154(b) by 437 days.

(21) Appl. No.: 14/824,562

(22) Filed: Aug. 12, 2015

(65) Prior Publication Data
US 2016/0047874 A1 Feb. 18, 2016

(30) Foreign Application Priority Data

Aug. 12, 2014 (DE) .......................... 10 2014 215 954

(51) Int. Cl.
| | |
|---|---|
| *G01V 3/00* | (2006.01) |
| *G01R 33/563* | (2006.01) |
| *G01R 33/48* | (2006.01) |
| *G01R 33/561* | (2006.01) |
| *G01R 33/56* | (2006.01) |

(52) U.S. Cl.
CPC ........ *G01R 33/5635* (2013.01); *G01R 33/482* (2013.01); *G01R 33/4824* (2013.01); *G01R 33/561* (2013.01); *G01R 33/5602* (2013.01)

(58) Field of Classification Search
USPC ....................................................... 324/309
See application file for complete search history.

(56) References Cited

U.S. PATENT DOCUMENTS

| | | | |
|---|---|---|---|
| 2007/0255129 | A1 | 11/2007 | Du et al. |
| 2007/0255130 | A1 | 11/2007 | Du |
| 2008/0154117 | A1 | 6/2008 | Nielles-Vallespin |
| 2009/0262996 | A1 | 10/2009 | Samsonov et al. |
| 2010/0246909 | A1* | 9/2010 | Blum ..................... A61B 5/055 382/128 |
| 2013/0076357 | A1 | 3/2013 | Grodzki et al. |
| 2014/0010428 | A1* | 1/2014 | Schmidt ............... A61B 5/0033 382/131 |
| 2014/0232396 | A1 | 8/2014 | Grodzki et al. |
| 2015/0265165 | A1* | 9/2015 | Muradyan ............ A61B 5/0263 600/419 |
| 2015/0276904 | A1 | 10/2015 | Grodzki |
| 2016/0324664 | A1* | 11/2016 | Piron ........................ A61F 2/46 |

OTHER PUBLICATIONS

Wu et al., "Bone Matrix Imaged In Vivo by Water and Fat Suppressed Proton Projection MRI (WASPI) of Animal and Human Subjects," J. Magn. Reson. Imaging, vol. 31, pp. 954-963 (2010).

(Continued)

*Primary Examiner* — Rodney Fuller
(74) *Attorney, Agent, or Firm* — Schiff Hardin LLP (57) ABSTRACT

A magnetic resonance scan sequence is executed in which nuclear spins are prepared in a preparation region with preparation parameters. The scan sequence provides first image data that image a scan region. The first image data are based on magnetic resonance data acquired with ultrashort echo times. The first image data are combined with reference image data that map the scan region, in order to obtain a resultant image.

14 Claims, 4 Drawing Sheets

(56) References Cited

OTHER PUBLICATIONS

Winkelmann. et al; "An Optimal Radial Profile Order Based on the Golden Ratio for Time-Resolved MRI"; IEEE Transactions on Medical Imaging 2007; vol. 26; No. 1; pp. 68-76, (2007).
Grodzki et. al.; "Ultrashort echo time imaging using pointwise encoding time reduction with radial acquisition (PETRA)"; Magn. Reson. Med.; vol. 67; 30. pp. 510-518, (2011).
Idiyatullin et al.: "Fast and quiet MRI using a swept radiofrequency", J. Magn. Reson., 181, pp. 342-349; (2006).
Weiger et al., "MRI with Zero Echo Time: Hard versus Sweep Pulse Excitation", Magnetic Resonance in Medicine, vol. 66, pp. 379-389, (2011).
Wu J. et al., "Bone matrix imaged in vivo by water-and-fat suppressed proton projection MRI (WASPI) of animal and human subjects" in J. Magn. Reson. Imaging vol. 31, pp. 954-963 (2010).

\* cited by examiner

QUIET MAGNETIC RESONANCE ANGIOGRAPHIC IMAGING

BACKGROUND OF THE INVENTION

Field of the Invention

The invention concerns techniques for magnetic resonance angiographic imaging or magnetic resonance perfusion imaging. In particular, the invention concerns magnetic resonance angiographic imaging with ultrashort echo times.

Description of the Prior Art

Various techniques are known for imaging blood vessels by means of magnetic resonance (MR) imaging (MR angiographic imaging). In one family of techniques, known as spin labeling methods, typically a scan sequence is carried out in which nuclear spins are prepared magnetically in a preparation region. Due to blood flow, the prepared nuclear spins in the blood move as a function of time into the scan region. Therein, image data of the prepared nuclear spins are acquired. A resultant image is typically obtained through a combination of the image data with reference image data. In this regard, the reference image data also map the scan region, although the nuclear spins are differently prepared than in the case of the image data. By this means, it is possible for blood vessels to be imaged with a comparatively high contrast in relation to the background, which is imaged the same or almost the same in the image data and the reference image data.

However, such conventional techniques of MR angiographic imaging can have various disadvantages. For instance, it can often occur that the scan sequences that are used produce a relatively high noise level in the interior of the MR scanner. Depending on the type of MR scanner and the type of scan sequence, the noise levels can reach a value of 100 dB(A). In such a case, it may be necessary for the person under examination to wear ear protection.

In order to lessen the noise level, various sequence optimizing techniques are known (see e.g. DE 10 2014 205 888.0). By means of such techniques, it is possible for the noise level to be reduced significantly. In particular, it is possible for the noise level to be reduced such that ear protection is unnecessary.

However, scan sequences are known that profit to only a small extent from such sequence optimization techniques. These are, in particular, scan sequences that are dependent on relatively rapid gradient pulses and relatively short switchover times of the gradient pulses in order to implement the required time sequence. In such cases, a noise reduction is often possible with adaptation of various parameters of the scan sequence, for example, a spatial resolution of the acquired MR data, echo time TE, repetition time TR, etc. However, such an adaptation of the parameters of the scan sequence can have a negative influence on the quality of the resultant image. The parameter space within which the parameters of the scan sequence can be adapted can also be technologically and/or physically restricted.

Particularly for scan sequences for MR angiographic imaging, a reduction in the noise level by means of the techniques mentioned above for sequence optimization is not possible or is possible only to a limited extent. This is because techniques of MR angiographic imaging are often based on rapid gradient echo-based scan sequences.

There is therefore a need for improved MR angiographic imaging techniques. There is a need, in particular, for techniques which provide a relatively quiet scan sequence for MR angiographic imaging. There is also a need, in particular, for such techniques which enable a relatively high quality in a resultant image of the MR angiographic imaging.

SUMMARY OF THE INVENTION

An object of the invention is to provide a magnetic resonance angiography method and apparatus that respond to these needs.

According to a first aspect of the invention, a method for MR angiographic imaging with ultrashort echo times is provided wherein a scan sequence is executed in which nuclear spins are prepared in a preparation region with preparation parameters. The scan sequence provides first image data. The first image data represent the scan region. The first image data are based on MR data acquired at ultrashort echo times. The method also includes combining the first image data with reference image data. The reference image data represent the scan region. The combining is carried out to obtain a resultant image.

By this technique, it is possible to prepare the nuclear spins or magnetization of the blood flowing into the scan region differently relative to the reference image data. For example, the nuclear spins can be prepared using preparation parameters which deviate from other preparation parameters with which the reference image data are obtained.

For example, the preparation region can be at least partially different from the scan region. It is however also possible for the preparation region to match the scan region.

The preparation with the preparation parameters can take place in a variety of ways. It is possible, for example, for a radio-frequency (RF) preparation pulse or pre-pulse to be radiated. This RF preparation pulse can bring about an inversion and/or a saturation of the nuclear spin in the preparation region.

In a simple implementation, the reference image data can be pre-determined. The reference image data can also be provided by the scan sequence. For example, the reference image data could be based on MR data that are obtained in the context of carrying out the scan sequence at a pre-set reference time point relative to a preparation with the preparation parameters.

The combination of the reference image data with the first image data can take the form, for example, of an addition, subtraction, division or multiplication. The reference image data and the first image data can be adapted by suitable weighting or by use of a suitable operator before or in the context of the combination. In this way, the resultant image can have increased contrast in the region of blood vessels (angiography).

However, it is also possible for the method to include the performance of a further scan sequence. In the further scan sequence, the nuclear spins in the preparation region can be prepared with further preparation parameters. The further scan sequence can provide the reference image data in the scan region. The reference image data can also be based on MR data acquired with ultrashort echo times.

In general, the preparation parameters can differ from the further preparation parameters. It is possible, for example, for the further preparation parameters to cause no, or no significant, change of parameters of the nuclear spin relative to a rest position in the preparation region. It is also possible, however, for the further preparation parameters to cause a complementary change of parameters of the nuclear spin in the preparation region in comparison with the preparation parameters. The preparation region associated with the preparation parameters can be different from the preparation region that is associated with the further preparation parameters.

For example, it is possible that, by means of the preparation parameters, saturation or inversion of the nuclear spins is caused slice-selectively in the preparation region, for example, at the height of a neck of the person under examination. This can cause the nuclear spin flowing into the scan region to be suitably magnetically prepared. The further preparation parameters, for example, may not require that no pre-pulses be radiated, or that pre-pulses be radiated that relate to a slice whose location at the isocenter of the relevant MR system is mirror imaged. Instead, at this location, the pre-pulses can cause saturation or inversion of the nuclear spins according to the preparation parameters. In other words, it is possible that, in the context of the performance of the further scan sequence, nuclear spins that are differently, or not at all, magnetically prepared, (as compared with the scan with the preparation parameters), reach the scan region.

Typically, it is possible for the techniques of MR imaging with ultrashort echo times to be carried out relatively quietly. Using the aforementioned techniques, it is therefore possible to achieve relatively quiet MR angiographic imaging.

Typically, the MR imaging with ultrashort echo times can also have a relatively high sensitivity to particular image parameters. It is possible, in such a way, to make particular structures more visible as compared with conventional MR angiographic imaging. In particular, it can be better, for example, to generate T1-weighted resultant images.

In general, a variety of scan sequences can be used that enable the acquisition of MR data with ultrashort echo times. The ultrashort echo time can be, for example, shorter than 1 ms, preferably shorter than 500 µs, particularly preferably shorter than 100 µs. It can be desirable to use such scan sequences in which gradient pulses reach their intended amplitude before excitation of the nuclear spins.

For example, the performance of the scan sequence can include activating a gradient pulse; and radiating an RF excitation pulse during a flat-top (plateau) of the gradient pulse; and acquiring MR data for scanned k-space points during the flat-top of the gradient pulse during an ultrashort echo time to provide the first image data.

It is also possible to radiate the RF excitation pulse during one and the same flat-top, during which the MR data are also acquired. Between the excitation and the readout, therefore, no or no significant change in the amplitude of the gradient pulse can occur. It is thus possible to reduce the switching processes of the gradient pulses. In this way, it is also possible to reduce mechanical vibrations evoked by the switching of the gradient pulses, so that noise generation can also be reduced. It is thus possible to implement particularly quiet MR angiographic imaging.

It is also possible, for example, for the gradient pulse not to be switched to zero between two successively radiated RF excitation pulses. In other words, it is also possible for the gradient pulse to be adjusted incrementally between two successively radiated RF excitation pulses.

For example, the scan sequence can be a zero TE scan sequence; see e.g. Weiger M. et al.: "MRI with zero echo time: hard versus sweep pulse excitation" in Magn. Reson. Med. 66 (2011) 379-389. It is also possible for the scan sequence to be a SWIFT scan sequence; see e.g. Idiyatullin D. et al., "Fast and quiet MRI using a swept radiofrequency" in J. Magn. Reson. 181 (2006) 342-349. It is also possible, for example, for the MR scan sequence to be a PETRA scan sequence; see Grodzki D. M. et al., "Ultrashort echo time imaging using pointwise encoding time reduction with radial acquisition (PETRA)" in Magn. Reson. Med. 67 (212) 510-518. It is also possible, for example, for the scan sequence to be a WASPI scan sequence; see, for example, Wu J. et al., "Bone matrix imaged in vivo by water-and-fat suppressed proton projection MRI (WASPI) of animal and human subjects" in J. Magn. Reson. Imaging 31 (2010) 954-963.

As is apparent from the above, the type of scan sequence that is used is not particularly restricted. It is also possible to combine the different types of scan sequence as described above or to use derived scan sequences. For example, in the context of the zero TE, SWIFT or WASPI scan sequences, k-space can be scanned along different radial k-space trajectories. However, it is also possible to use Cartesian k-space trajectories.

In the context of the PETRA scan sequence, k-space points located in a central or inner region of the k-space can be scanned with a Cartesian k-space trajectory. K-space points located in an outer region of the k-space can be scanned with a radial k-space trajectory. The k-space trajectory denotes the sequence of k-space points for which the MR data are acquired and entered into k-space (scanned k-space points).

For example, the performance of the scan sequence can include acquiring MR data for scanned k-space points situated in a first imaging region of the k-space along a radial k-space trajectory, and acquiring MR data for scanned k-space points situated in a second imaging region of the k-space along a Cartesian k-space trajectory. The second imaging region can contain the k-space center, i.e. it is an inner region of k-space. The first imaging region can include at least some data pints that are different from those of the second imaging region. The execution of the scan sequence can further include combining of the MR data of the k-space points situated in the first imaging region with the MR data of the k-space points situated in the second imaging region, in order to provide the first image data.

It is possible, for example, for the first imaging region and the second imaging region to adjoin one another. For example, the second imaging region can be circular and the second imaging region can be centered relative to the k-space center. Accordingly, the first imaging region can be circular; it is possible that the first imaging region and/or the second imaging region are also centered relative to the k-space center.

It can be desirable for the vessel imaging to be undertaken with a temporal resolution. This can be desirable, for example, in the context of perfusion imaging. For example, the performance of the scan sequence can include for each scanned k-space point, multiple acquisitions of MR data at pre-set points in time relative to the preparation with the preparation parameters. The first image data thus includes acquisitions (subsets of data) that are each provided, individually, for each pre-set time point.

For example, the method can further include, for each subset of first image data, combining the image data of the respective subset with the reference image data that map the scan region, in order to obtain a resultant image in each case. It may also be possible for different subsets of first image data to be combined with different reference image data.

In this way, therefore, multiple resultant images can be obtained that each correspond to a respective time difference between the preparation with the preparation parameters and the measuring time point. The time point can be pre-set in each case with a selected precision or tolerance. This precision or tolerance can limit the time resolution of the vessel imaging.

In other words, the preparation can be carried out multiple times with the preparation parameters. Each preparation with the preparation parameters can comprise the radiating in of an RF preparation pulse. The acquisition of the MR data can take place in an interleaved manner in relation to the RF preparation pulse.

The first image data that are acquired at a respective pre-set time point can also be designated a phase of the vessel imaging. In order to achieve a higher time resolution for the vessel imaging, it can be desirable to make a larger number of phases available; it can also be desirable in this respect to select the precision of the respective time points particularly high or to select the tolerance to be particularly low.

Thus the MR scan sequence can include multiple preparation of the nuclear spin in the preparation region with the preparation parameters, wherein the MR data are acquired interleaved in relation to the multiple preparation. For example, it is possible that for a first k-space point, to acquire the MR data at a particular pre-set time point following a first preparation and, for a second k-space point, to acquire the MR data at the particular pre-set time point after a second preparation. Such techniques are also designated interleaved acquisition.

For example, that for each pre-determined time point following preparation with the preparation parameters, MR data can be acquired for a selected number of k-space points. For each acquisition an RF-excitation pulse can be radiated. The radiating of the RF excitation pulse and the subsequent acquisition of MR data is also designated a segment or a repetition. For each phase following on from an RF excitation pulse, therefore, a particular number of segments can be processed.

As described above, the scan sequence can be a PETRA scan sequence. In this case, the number of phases per preparation in the first imaging region of the k-space is smaller than the number of phases per preparation in the second imaging region. In other words, a precision with which the time point of acquisition of the MR data is determined in the outer region of k-space can be smaller than a precision with which the time point is determined in the inner region of k-space.

For example, the performance of the scan sequence can include, for each scanned k-space point situated in the first imaging region: n acquisitions of MR data at pre-set time points relative to a preparation with the preparation parameters, and for each scanned k-space point situated in the second imaging region, m acquisitions of MR data at pre-set time points relative to a preparation with the preparation parameters. In this embodiment, m can be larger than n. For example, m can be twice as large as n or three times as large as n.

For example, the MR data of the scanned k-space points situated in the second imaging region can be combined, in each case, with multiple values of MR data of the scanned k-space points situated in the second imaging region, e.g. according to the ratio of m to n. In this way, complete data records can be obtained for the different phases without the necessity to acquire the same number of MR data in the first region of k-space as in the second region of k-space.

By techniques of this type, a relatively high time resolution can be achieved for the vessel imaging with simultaneously a relatively low time duration for carrying out the scan sequence (scan duration). This is the case since in the first imaging region of k-space, a relatively small number of phases must be processed; simultaneously, in the central region of k-space, i.e. the second imaging region, a comparatively large number of phases is present. The central region of the k-space is typically decisive for contrast and the image quality of the resultant image. In this way, it is possible to achieve a relatively good image quality and a high temporal resolution for the vessel imaging although in the outer region of k-space, a relatively low number of phases is processed and thus the scan duration is relatively short.

The combining of the MR data of k-space points situated in the first imaging region with the MR data of k-space points situated in the second imaging region can be carried out, generally, in a variety of ways. It is possible, for example, to perform the combining according to a sliding window segmentation scheme. It is also possible, in each case, to combine MR data of the k-space points situated in the first imaging region with those MR data of k-space points that are situated in the second imaging region that have a minimum temporal spacing of the corresponding time points. This allows the time points of the phases to be determined with a relatively high precision and a relatively low tolerance. Alternatively or additionally, it is also possible for a first number of MR data of the k-space points situated in the first imaging region to be combined with a second number of k-space points situated in the second imaging region according to a combination algorithm. For example, the combination algorithm can take account of a temporal spacing of the respectively combined MR data. For example, at least one of the first number and the second number could be greater than one. The combination algorithm can take account during combination of, for example, weights. For example, MR data of this type, the corresponding time points of which have a smaller (larger) temporal spacing are taken into account with a larger (smaller) weighting during the combination.

For example, the acquisition of the MR data of the k-space points situated in the first imaging region can include acquiring MR data for k-space points along a first radial spoke of the radial k-space trajectory, and subsequently acquiring MR data for k-space points along a second radial spoke of the radial k-space trajectory, and subsequently acquiring MR data for k-space points along a third radial spoke of the radial k-space trajectory. The third radial spoke can be arranged in k-space between the first radial spoke and the second radial spoke. In other words, a pre-set sequence for the acquisition of MR data along different radial spokes of the radial k-space trajectory uniformly fills different regions of k-space. For example, a golden angle scheme can be used; see e.g. Winkelmann S. et al., "An optimal radial profile order based on the golden ratio for time-resolved MRI" in IEEE Trans. Med. Imag. 26 (2007) 68-76. By such techniques, any desired amount of MR data entered at a number of k-space points situated in the first imaging region of k-space can be designated so as to be situated in the second imaging region of the k-space, i.e. in a central k-space region. A mean temporal spacing between the MR data in the first imaging region and the MR data in the second imaging region thus can be made relatively low. In this way, as well, time-resolved vessel imaging can be increased.

Figure 5:
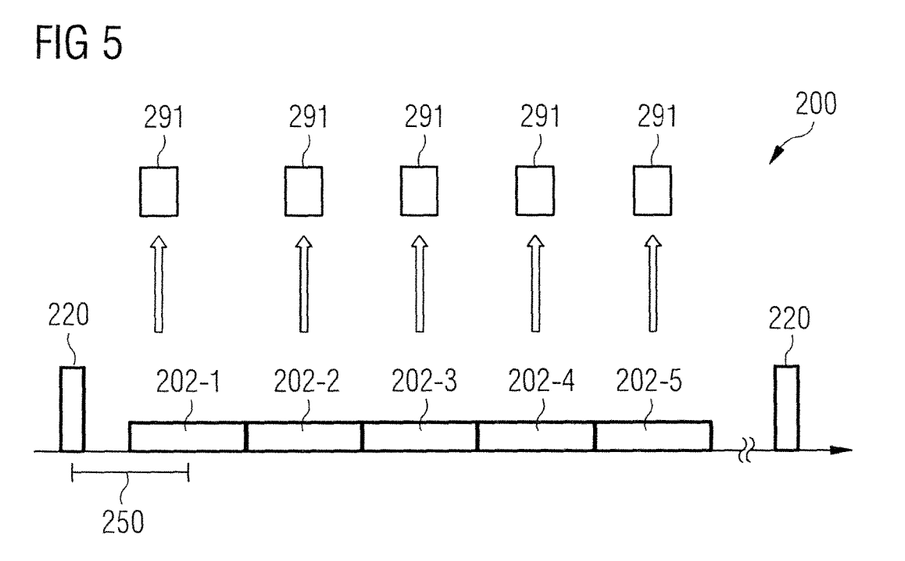
FIG. 5 corresponds to FIG. 2 wherein, per preparation, image data are provided for a small number of phases.

Typically, the different scan sequences operate with ultrashort echo times, as discussed above, in three dimensions. It is possible that no, or only a restricted slice selectivity exists during imaging. For example, it is possible to carry out the different scan sequences in the two-dimensional projection mode, i.e. with an infinitely thick slice thickness for the reading out or k-space encoding—and by this means, shorter scan durations can be achieved. It is possible to carry out the different techniques described herein in a projection mode of this type. This corresponds to encoding in a type of slice in the k-space by means of several central points and radial spokes (FIG. 5). It is also possible to record projection images in different orientations and to bring these together, for example, with a Radon transform of individual lines to a 3-D data set. Alternatively or additionally, techniques of regridding can be used. This can have the advantage—since possibly only a few projections are needed—that the individual image data can be significantly more rapidly recorded and thereby a greater tolerance to movement can be achieved. It is possible, in the context of a Radon transformation, to delete such imaged regions outside a "region of interest".

In other words, the execution of the scan sequence can be repeated a number of times so as to obtain multiple first image domain projections. The multiple first image domain projections can image the scan region from different directions. The method can further include combining multiple first image space projections in order to obtain a two-dimensional slice-selective image as the first image data.

It is also possible, however, to carry out the scan sequence in the two-dimensional projection mode, i.e. to perform the scan sequence only once to obtain a first image space projection which images the scan region from a pre-set direction. In this way, the scan duration can be reduced.

According to a further aspect, the present invention relates to an MR system. The MR system is configured for MR angiographic imaging with ultrashort echo times. The MR system has a scanner with a transmitting/receiving unit. The transmitting/receiving unit is configured to carry out a scan sequence in which the nuclear spins are prepared in a preparation region with preparation parameters. The scan sequence provides first image data which map a scan region. The preparation region is at least partially different from the scan region. The first image data are based on MR data acquired with ultrashort echo times. The MR system also has a computer that is configured to combine the first image data with reference image data which map the scan region. A resultant image is obtained by means of the combination.

The MR system is configured to implement the method for MR angiographic imaging with ultrashort echo times according to the present invention, as described above.

For an MR system of this type, effects can be achieved that are comparable to the effects achieved by the method for MR angiographic imaging with ultrashort echo times according to the present invention.

Features of the embodiments and aspects of the invention described above can be combined with one another. In particular, the features can be used not only in the combinations described, but also in other combinations or individually, without departing from the field of the invention.

Various features and effects have been described above in relation to the scan sequence that provides the first image data. However, it is also possible for the further scan sequence that provides the reference data to have corresponding features and to achieve corresponding effects. In particular, it is possible for the further scan sequence to be a PETRA scan sequence.

DESCRIPTION OF THE PREFERRED EMBODIMENTS

The present invention will be described in greater detail on the basis of preferred embodiments and making reference to the drawings. In the drawings, the same reference signs denote the same or similar elements. The figures are schematic representations of different embodiments of the invention. Elements shown in the drawings are not necessarily shown to scale. Rather, the different elements shown in the drawings are reproduced so that their function and general purpose are comprehensible to a person skilled in the art. The links and couplings shown in the figures between the functional units and elements can also be implemented as indirect links or couplings. A link or coupling can be implemented wire-bound or wirelessly. Functional units can be implemented as hardware, software or a combination of hardware and software.

Techniques for quiet dynamic MR angiographic imaging or MR perfusion imaging will now be described. These techniques use scan sequences with ultrashort echo times, for example PETRA, zero TE, WASP or SWIFT scan sequences. In a first scan sequence, first image data are obtained. The blood flowing into a scan region is prepared with first preparation parameters. In a further scan sequence, reference image data are obtained. The blood flowing into the scan region is prepared with second preparation parameters which, in particular, are different from the first preparation parameters. By combining the first image data with the reference image data, a vessel representation can be achieved. For example, the first image data and the reference image data can be combined with or offset against one another by subtraction during the post-processing. This can have the effect that a resultant image produced displays regions into which the magnetically prepared nuclear spins have flowed only as light or dark, i.e. the blood vessels appear in particularly high contrast. This vessel representation can be carried out in the perfusion imaging, in particular, time-resolved. For this purpose, it is possible that MR data are acquired for a number of temporal phases per preparation. With a "shot" of this type, the dynamics of the blood flow can be acquired. Typically, a number of RF excitation pulses or acquisition processes of MR data per phase is designated as segments. In order to be able to acquire sufficient MR data per phase overall, it may be necessary to record a number of shots in which in corresponding segments, MR data of complementary k-space regions are acquired in each case. In particular, an interleaved recording technique can be used in relation to the different preparations or shots. Typically, the number of scan procedures available overall per phase is equal to the product of the number of segments and the number of preparations.

Figure 1:
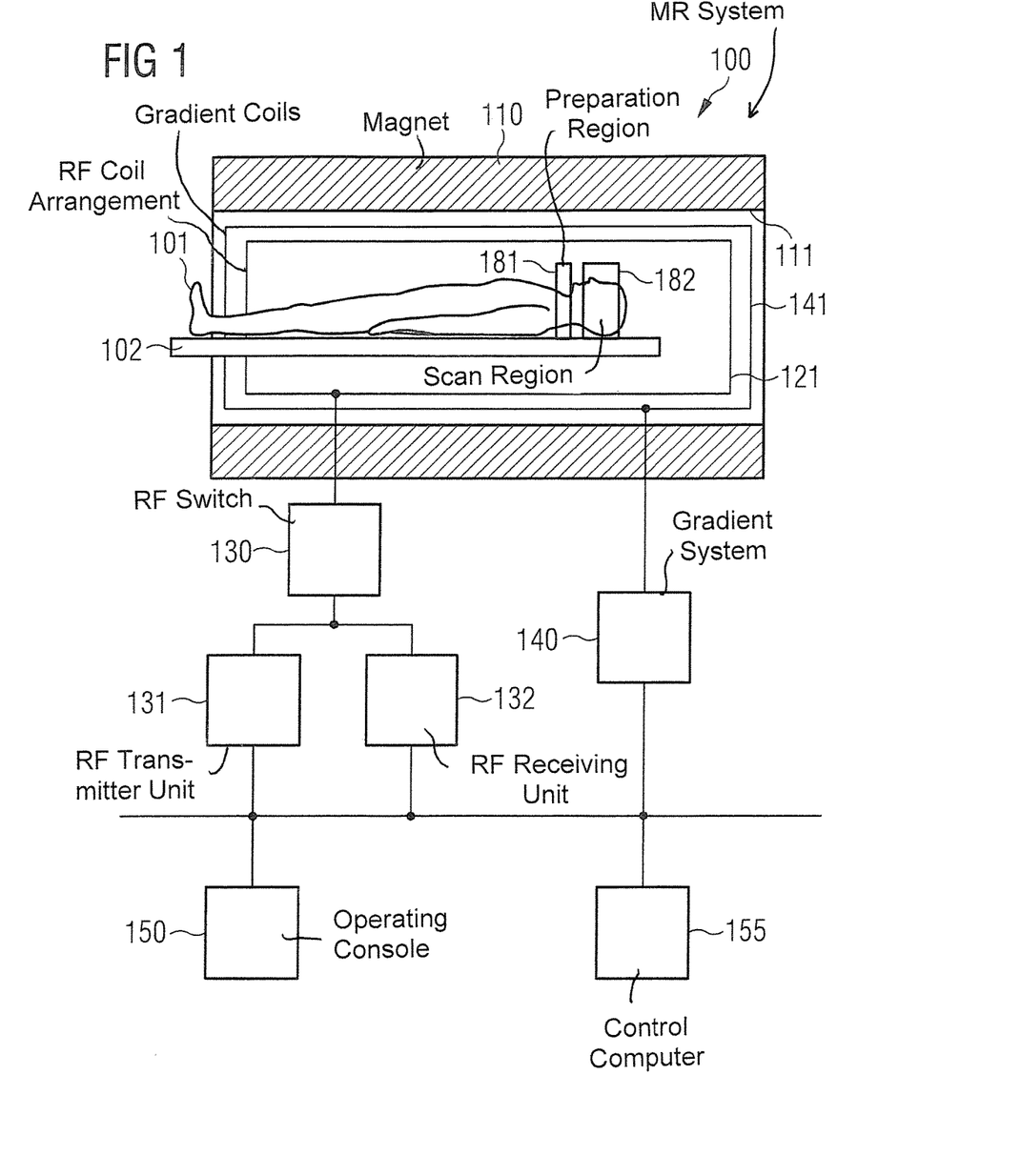
FIG. 1 is a schematic illustration of an MR system.

FIG. 1 shows an MR system 100 that is configured to execute techniques, methods and steps according to the invention as described above. The MR system has a scanner with a magnet 110 that defines a tube 111. The magnet 110 can generate a uniform magnetic field parallel to its longitudinal axis. The uniform magnetic field may exhibit inhomogeneities therefor, that is, local deviations from a target value. An object under examination, in this case a person under examination 101, can be moved into the magnet 110 on a patient table 102. The MR system 100 also has a gradient system 140 for generating gradient fields by switching (activating) gradient pulses. The gradient fields are used for spatial encoding of MR data acquired in the context of the MR imaging.

Typically, the gradient system 140 has at least three gradient coils 141 that are separately controllable and positioned in a defined way. The gradient coils 141 enable the gradient fields to be switched along particular spatial directions (gradient axes). The gradient fields can be used, for example, for slice selection, for frequency encoding—i.e. in the readout direction—and for phase encoding.

For excitation of nuclear spins in a subject to cause the spins to depart from the polarization or orientation resulting in the uniform magnetic field in the longitudinal direction, an RF coil arrangement 121 is provided, which radiates an amplitude-modulated RF excitation pulse into the person under examination 101. A transverse magnetization is thus given to the nuclear spins. In order to generate RF excitation pulses of this type, an RF transmitter unit 131 is connected via an RF switch 130 to the RF coil arrangement 121. The RF transmitter unit 131 includes an RF generator and an RF amplitude modulation unit. The RF excitation pulses tilt (flip) the spins one-dimensionally slice-selectively or two-dimensionally/three-dimensionally spatially selectively or globally out of the rest position to produce the transverse magnetization.

Furthermore, an RF receiving unit 132 is coupled via the RF switch 130 to the RF coil arrangement. With the RF receiving unit 132, MR signals emitted by the spins while relaxing from the transverse magnetization are acquired as MR data, for example, by inductive coupling into the RF coil arrangement 121. The MR system 100 is configured to execute scan sequences with ultrashort echo times. This means that the RF switch 130 can switch particularly rapidly between transmission operation and receiving operation, for example, in less than 1 ms.

The MR system 100 further has an operating console 150 that includes, for example, a screen, a keyboard, a mouse, etc. Via the operating console 150, user inputs can be acquired and outputs to the user can be presented. For example, it is possible via the operating console 150, to set individual operating modes or machine control parameters of the MR system by the user and/or automatically and/or under remote control.

Furthermore, the MR system 100 has a control computer 155. The control computer unit 155 is configured to cause different techniques to be implemented in connection with the control of the scan sequence. The control computer 155 is also configured to control the RF transmitter unit 131, the RF switch 130, the RF receiving unit 132 and the gradient system 140. In this way, different scan sequences can be executed with ultrashort echo times. For example, the zero TE, SWIFT, WASPI or PETRA scan sequences can implemented. Each such scan sequence provides first image data that map one scan region 182. Furthermore, the control computer 155 can access previously acquired reference image data 192 that also map the scan region 182. It is also possible for the reference image data to be obtained by executing a further scan sequence. The further scan sequence can correspond to the scan sequence for obtaining the first image data, but the nuclear spins may be differently prepared.

The control computer is configured to cause different techniques to be executed in connection with the post-processing of acquired image data and reference image data. In particular, the control computer 155 is configured to provide a resultant image by combining the image data and the reference image data. The resultant image represents blood vessels of the person under examination in the scan region 182 with particularly high contrast in relation to the background. For this purpose, in the context of the scan sequence, nuclear spins are prepared with preparation parameters in a preparation region 181 which is spaced apart from the scan region 182. For this purpose, for example, a pre-pulse or an RF inversion pulse or an RF saturation pulse are radiated into the preparation region 181 slice-selectively by the RF transmitter unit 131. In general, the scan region 182 can also match the preparation region 181.

Figure 2:
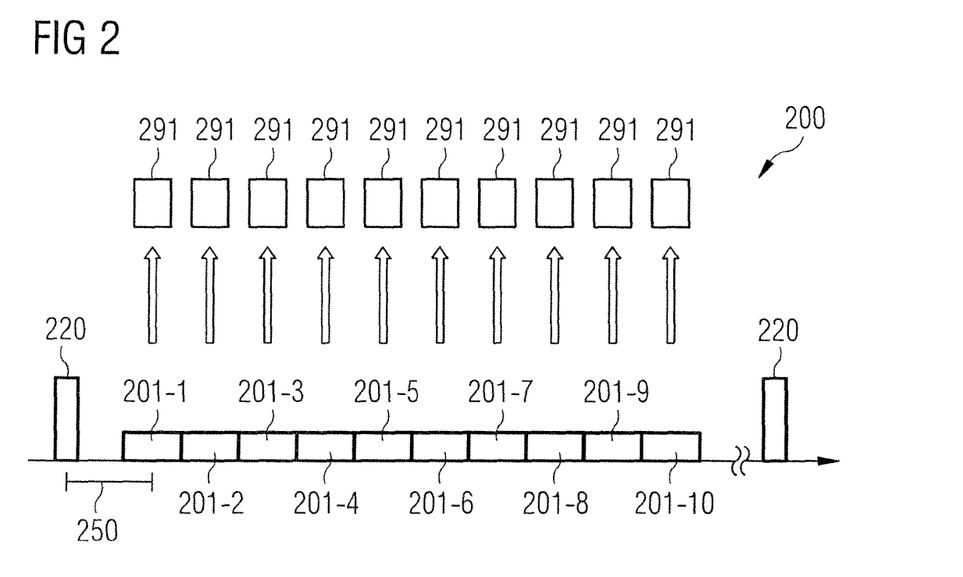
FIG. 2 depicts a scan sequence according to the invention which provides first image data for different phases which correspond to different time points relative to a preparation with preparation parameters, wherein each phase comprises a plurality of segments or repetitions.

FIG. 2 shows the scan sequence 200. Firstly, a pre-pulse or RF preparation pulse 220 is radiated. The RF preparation pulse 220 causes an inversion or a saturation of the nuclear spins in the preparation region 182 that resonate at the set resonant frequency at which the scanner is being operated. In the scenario in FIG. 2, the RF preparation pulse 220 sets a point in time of the preparation of the nuclear spins. In general, it is possible for a larger number of RF preparation pulses to be radiated, for example, in combination with particular gradient pulses; in such a case, the point in time of the preparation can be stipulated differently. Thereafter, the acquisition of the image data 291 takes place. The acquisition of the image data 291 takes place for ten different phases 201-1 to 201-10, wherein more or fewer phases 201-1 to 201-10 can be used. For each of the different phases 201-1 to 201-10, MR data are acquired for corresponding k-space points, although at respectively different points in time 250 relative to the preparation with the RF preparation pulse 220. The time 250 between radiating the RF preparation pulse 220 and the different phases 201-1 to 201-10 determines the distance the nuclear spins have moved between the preparation and the recording of the MR data. Therefore, the time point in time 250 should be matched to a separation between the preparation region 181 and the scan region 182 and to a flow speed of the blood in the vessels to be imaged. First image data 291 are obtained in each case from the various MR data. For example, a corresponding resultant image could be generated for each of the first image data 291 of the different phases 201-1 to 201-10. By this procedure, the vessel imaging can be carried out with a particular time resolution.

For example, from the scan sequence 200 of FIG. 2 a further scan sequence can be obtained with other, further preparation parameters and in this way to obtain the reference image data. In one scenario, a non-slice-selective RF inversion pulse is used for the further scan sequence. It is possible in such a case for the preparation region 182 to match the scan region 181 for the scan sequence 200. For example, the further scan sequence can also be executed with ultrashort echo times. In particular, the further scan sequence can be executed in accordance with the scan sequence 200, that is, with comparable parameters such as echo time, repetition time, k-space trajectory, etc. However, it might be unnecessary, in particular, during the further scan sequence to provide a number of reference image data for different phases. It may not be necessary for the reference image data to have a temporal resolution. It is possible for the different image data 291 of the different phases 201-1 to 201-10 to each be combined with the same reference image data.

It is shown in FIG. 2 that the different phases 201-1 to 201-10 have a particular temporal extent (shown horizontally in FIG. 2); accordingly, the time point 250 can only be determined imprecisely or within a certain tolerance. This typically limits a time resolution of the vessel imaging. By means of the temporal extent of the phases 201-1 to 201-10, it is possible to acquire MR data for a plurality of scanned k-space points (repetitions) per phase 201-1 to 201-10. The longer (shorter) the temporal extent of the phases 201-1 to 201-10 is, the more (fewer) repetitions can be carried out per phase 201-1 to 201-10; at the same time, a temporal resolution of the vessel imaging can be lower (higher), since the time point relative to the RF preparation pulse 220 is less precisely (more precisely) stipulated; at the same time, the scan duration of the scan sequence can be shorter (longer).

In particular, a situation can arise in which for each preparation with the RF preparation pulse 220, not all the MR data of the k-space points of the image data 291 of a phase 201-1 to 201-10 can be acquired. In order that the image data 291 can be completed, it may be necessary, for example, following a particular dead time, to prepare the nuclear spin by renewed radiating-in of the RF preparation pulse 220 (see FIG. 2, extreme right). Then, the missing MR data can be acquired (not shown in FIG. 2). Techniques of this type are referred to as an "interleaved acquisition" scheme.

As a result, it is also possible, following preparation in the case of implementation of FIG. 2 by means of the RF preparation pulse 220, to acquire MR data for a particular number of phases 201-1 to 201-10. The first image data 291 can be obtained from each phase 201-1 to 201-10. For example, techniques of parallel imaging in which the k-space is undersampled, can be used. It may then be possible to reconstruct missing MR data in order to obtain the first image data 291. The various first image data 291 have a different blood flow state due to the different time points 250 relative to the preparation with the RF preparation pulse 220. During each phase 201-1 to 201-10, a number of repetitions are processed, i.e. MR data are acquired for a number of k-space points.

Figure 3:
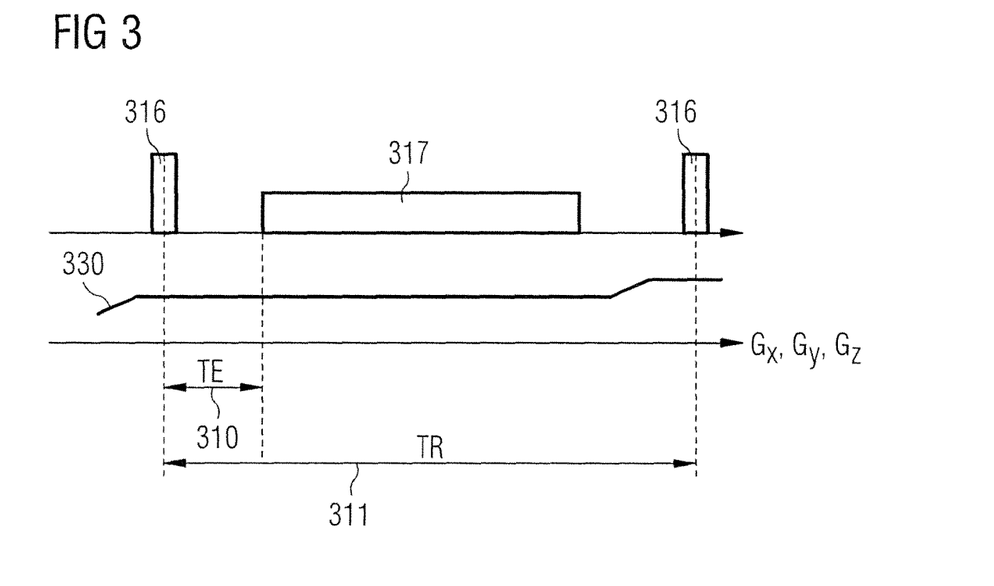
FIG. 3 is a repetition of FIG. 2 for a PETRA scan sequence in an outer region of the k-space in which MR data are acquired for k-space points along a radial k-space trajectory.

The acquisition of the MR data for the k-space points can take place in a variety of ways. It is possible, for example, to acquire the MR data for k-space points along a radial k-space trajectory. This is shown in FIG. 3. Firstly, a gradient pulse 330 is switched. For example, at least two gradient pulses 330 can be switched along different directions Gx, Gy, Gz; this determines the orientation of the respective radially oriented k-space arm of the k-space trajectory. For example, the different radially oriented k-space arms of the radial k-space trajectory can be processed in a sequence which is determined, for example, by means of a golden angle scheme.

At a particular point in time, the gradient pulse 330 reaches a desired amplitude or full strength. The amplitude of the gradient pulse 230 then does not change or change significantly as a function of time (a flat-top). During the flat-top, an RF-excitation pulse 316 is radiated in. Following an echo time 310, TE, the readout time span 317 is begun in order to acquire the MR data for different k-space points along a radially oriented arm of the radial k-space trajectory. Between the RF excitation pulse 316 and the readout time span 317, the amplitude of the gradient pulse 330 does not change or change significantly. Advantageously, the echo time 310 corresponds to a hardware-set minimum time for switchover by the RF switch 130 between a transmit mode and a receive mode.

In the implementation shown in FIG. 3, the gradient pulses 330 are therefore switched before the RF excitation pulse 316 is radiated. In this way, it is possible, in particular, for the echo time 310 to be selected to be ultrashort. Furthermore, the execution of the scan sequence 200 can take place relatively quietly, since between the radiating of the RF excitation pulse 316 and the readout time span 317, no further switching of the gradient pulse 330 is necessary. It is possible, in particular, to scan a relatively large number of k-space points per switching of the gradient pulse 330; in this way, a total number of switching processes of the gradient pulse 330 in the scan sequence 200 is reduced.

A scenario is shown in FIG. 3 in which the k-space points for which the MR data are acquired are arranged along a radial k-space trajectory. Using such techniques, however, the MR data can be acquired along a Cartesian k-space trajectory.

Figure 4:
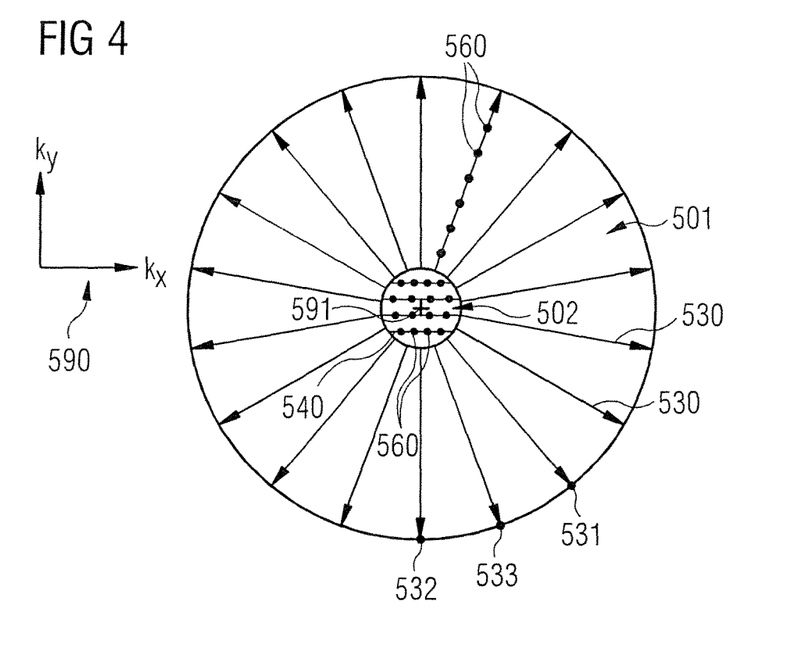
FIG. 4 schematically illustrates the inner region and the outer region of the PETRA scan sequence without encoding in the kz-direction of FIGS. 3 and 4.

It is essentially possible for the entirety of k-space to be scanned (filled) either with a Cartesian k-space trajectory or with a radial k-space trajectory. However, it is also possible to combine both techniques, for example, in the context of the PETRA scan sequence (see FIG. 4). For example, MR data for scanned k-space points 560 situated in a first imaging region 501 of the k-space 590 are scanned along a radial k-space trajectory 530 (see FIG. 3). It is possible for MR data for scanned k-space points 560 situated in a second imaging region 502 of the k-space 590 to be acquired along a Cartesian k-space trajectory 540. In the implementation of FIG. 4, both the first imaging region 501 and the second imaging region 502 are centered relative to the center of k-space 540 and have a circular or annular form. The first imaging region 501 adjoins the second imaging region 502 and surrounds it. The second imaging region 502 contains the k-space center 591. The first image data 291 then include the MR data of the k-space points 560 from the first imaging region 501 and the MR data of the k-space points 560 of the second imaging region 502. With the PETRA scan sequence, it is possible to achieve a relatively high sampling density of k-space points 560 even close to the center 591 of the k-space 590—particularly in comparison with a scan sequence in which scanning takes place only along the radial k-space trajectory 530. Typically, the proportion of k-space points for which MR data are acquired in the second imaging region 502 along the Cartesian k-space trajectory 540 relative to the total number of k-space points is relatively low. For example, approximately 2000 to 4000 k-space points 560 can be located in the second imaging region 502; accordingly, for example, 50,000 to 100,000 k-space points 560 can be located in the first imaging region 501.

It has been described above that in the context of the PETRA scan sequence, the k-space is divided into the first imaging region 501 in which the k-space points 560 are scanned along the radial k-space trajectory 530 and the second imaging region 502 in which the k-space points 560 are scanned along the Cartesian k-space trajectory 540. For example, in such a case, for the Cartesian portion of the scan sequence 200—i.e. in the second imaging region 502—the number of repetitions 311 per phase 201-1 to 201-10 can be smaller than the number of repetitions per phase 201-1 to 201-10 for the radial proportion of the scan sequence 200 (see FIGS. 2 and 5)—i.e. in the first imaging region 501). This means that the temporal resolution of the vessel imaging in the second imaging region 502 of the scan sequence 200 is higher than in the outer first imaging region 501. Following the radiating-in of an RF preparation pulse 220, in the first imaging region 501 (in the second imaging region 502) fewer (more) phases are processed before the next RF preparation pulse 220 is radiated in.

Thus, for example, the performance of the scan sequence can include, for each scanned k-space point 560 situated in the first imaging region 501, n acquisitions of MR data at pre-set points in time 250 relative to the preparation 220 with the preparation parameters, and for each scanned k-space point 560 situated in the second imaging region 501, m acquisitions of MR data at pre-set time points 250 relative to the preparation 220 with the preparation parameters. The number m can be larger than n.

In such a case, it may be necessary to repeat the preparation by radiating in the RF preparation pulse 220 for the central second imaging region 502 of the k-space 590 relatively more frequently. However, at the same time, a particularly high resolution of the vessel imaging can be achieved. It is possible, for example, using a sliding-window approach over the corresponding phases 202-1 to 202-5 of the outer first imaging region 501 of the k-space 590 overall to achieve a relatively greater temporal resolution of the vessel imaging.

In other words, the combination of the MR data of the k-space points 560 situated in the first imaging region 501 with the MR data of the k-space points 560 situated in the second imaging region 502, can take place according to a sliding window segmentation scheme. It is also possible, alternatively or additionally that, in each case, MR data of the k-space points 560 situated in the first imaging region 501 are combined with those MR data of the k-space points 560 that are situated in the second imaging region 502 which have a minimum temporal spacing of the relevant time points.

The acquisition of MR data close to the k-space center 591 can be particularly advantageous since the quality of the resultant image typically depends heavily on the k-space points in the second imaging region 502. Typically, these k-space points in the inner region of the k-space 590 influence the contrast of the resultant image relatively strongly. If these MR data are present with a greater temporal resolution, i.e. comparatively many phases 201-1 to 201-10 are acquired for the second imaging region 502, it may be unnecessary—given approximately equal quality of the vessel imaging, which a correspondingly high resolution is provided for the first imaging region 501.

Figure 6:
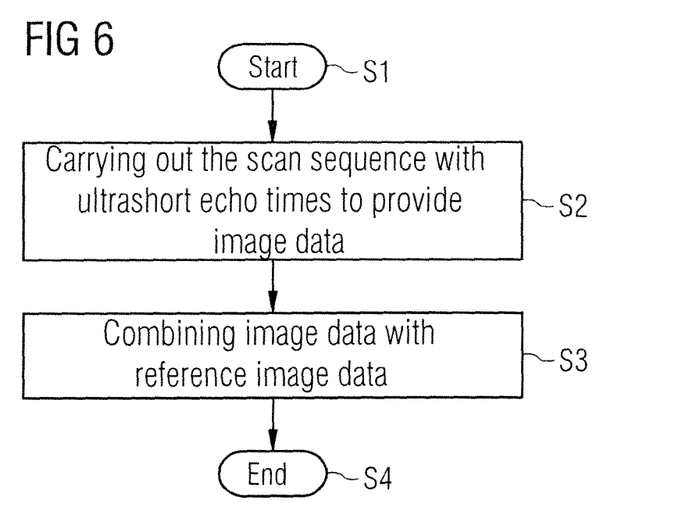
FIG. 6 is a flowchart of a method according to different embodiments.

FIG. 6 shows a flowchart of a method for MR angiographic imaging according to different exemplary embodiments. The method begins at step S1. First, in step S2, the scan sequence 200 is executed with ultrashort echo times 310. For example, the scan sequence 200 can be a PETRA scan sequence. The scan sequence 200 provides first image data 291 which image the scan region 182. In the context of the scan sequence 200, the nuclear spins are prepared in the preparation region 181 with preparation parameters.

In step S3, the post-processing is carried out. In step S3, the image data from step S2 are combined with reference image data. The reference image data also represent the scan region 182. The reference image data can be provided, for example, by a further scan sequence wherein nuclear spins are prepared in the preparation region 181 with further preparation parameters which differ from the preparation parameters of the scan sequence 200. In this way, vessel imaging can be achieved in a resultant image which is obtained by combining the first image data 291 with the reference image data. The method ends in step S4.

Although the invention has been illustrated and described in detail based on the preferred exemplary embodiments, the invention is not restricted by the examples given and other variations can be derived therefrom by those skilled in the art without departing from the scope of the invention.

Various features and effects have been described above in relation to the scan sequence 200 which provides the first image data 291. It is also possible accordingly to realize these features and aspects in relation to the further scan sequence which provides the reference image data.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for magnetic resonance (MR) angiographic imaging, comprising:
   operating an MR scanner to execute a scan sequence in which nuclear spins in a subject situated in the MR scanner are prepared in a preparation region with preparation parameters and, after preparing said nuclear spins, MR image data are acquired at ultrashort echo times from a scan region of the subject, said MR image data representing an image of the scan region;
   in a processor provided with said MR image data, accessing reference image data that represent a reference image of the scan region, and combining said MR image data with said reference image data to produce a resultant image; and
   making the resultant image available in electronic form at an output of the processor, as a data file.

2. A method as claimed in claim 1 comprising operating said MR scanner in said scan sequence to activate a gradient pulse having a flat pulse plateau, and radiating a radio-frequency (RF) excitation pulse during said flat pulse plateau of said gradient pulse, and acquiring said MR image data as scanned k-space points of an electronic memory at which said MR image data are entered during said flat pulse plateau of said gradient pulse during a respective ultrashort echo time.

3. A method as claimed in claim 1 comprising selecting said scan sequence from the group consisting of zero TE, SWIFT, WASPI, and PETRA.

4. A method as claimed in claim 1 comprising operating said MR scanner in said scan sequence to acquire said MR image data in multiple acquisitions respectively occurring at predetermined points in time following the preparation of the nuclear spins with the preparation parameters, and entering said MR image data at respective k-space points in an electronic memory that correspond to each predetermined point in time.

5. A method as claimed in claim 1 comprising:
   operating said MR scanner in said scan sequence to acquire a first subset of said MR image data and entering said first subset of said MR image data at k-space points in an electronic memory representing k-space, along a radial k-space trajectory in a first region of k-space;
   operating said MR scanner in said scan sequence to acquire a second subset of said MR image data and to enter said second subset of MR image data into said electronic memory at k-space points along a Cartesian k-space trajectory in a second region of k-space, said second region containing the center of k-space and containing at least some k-space points that are not contained in said first region; and in said processor, combining said first and second subsets of MR data respectively in said first and second regions of k-space to obtain a totality of said MR image data.

6. A method as claimed in claim 5 comprising operating said MR scanner in said scan sequence to:

enter said first subset of said MR data at n k-space points in said first region respectively at predetermined points in time following said preparation of said nuclear spins with said preparation parameters; and enter said second subset of MR data at m k-space points in said second region of k-space at predetermined points in time following said preparation of said nuclear spins with said preparation parameters, wherein m is greater than n.

7. A method as claimed in claim 6 comprising combining said first and second subsets of MR image data respectively in said first and second image regions according to a sliding window segmentation scheme.

8. A method as claimed in claim 6 comprising combining MR image data in said first subset, which are situated at respective k-space points in said first region, with MR image data in said second subset, which are situated at respective k-space points in said second region that have a minimum temporal spacing with the respective k-space points of said MR image data in said first subset.

9. A method as claimed in claim 5 comprising entering said MR image data in said first subset in said first region along first, second and third successively acquired radially oriented arms of said radial k-space trajectory, with said third radially oriented arm being situated in k-space between said first radially oriented arm and said second radially oriented arm.

10. A method as claimed in claim 1 comprising operating said MR scanner in said scan sequence to acquire said MR image data in multiple acquisitions respectively occurring at predetermined points in time following the preparation of the nuclear spins with the preparation parameters, and entering said MR image data at respective k-space points in an electronic memory that correspond to each predetermined point in time, and wherein the preparation of said nuclear spins comprises multiple individual preparations each comprising radiating a radio-frequency preparation pulse, with the respective multiple acquisitions of said MR image data being interleaved with the respective multiple individual preparations.

11. A method as claimed in claim 1 comprising operating said MR scanner in said scan sequence to prepare said nuclear spins by radiating a radio-frequency preparation pulse that causes an inversion or a saturation of said nuclear spins in said preparation region.

12. A method as claimed in claim 1 comprising operating said MR scanner to execute a further scan sequence in which said nuclear spins are prepared in said preparation region with further preparation parameters, and acquiring said reference image data from said scan region in said further scan sequence also at ultrashort echo times.

13. A method as claimed in claim 1 comprising operating said MR scanner to execute said scan sequence a plurality of times, with said MR image data being obtained in each repetition of said scan sequence as an image domain projection of the scan region, with the respective image domain projections of said scan region being from respectively different directions, and, in said processor, combining said plurality of image domain projections to obtain a two-dimensional, slice-selective image of said scan region as said first image data.

14. A magnetic resonance (MR) apparatus for MR angiographic imaging, comprising:

an MR scanner;

a control computer configured to operate said MR scanner to execute a scan sequence in which nuclear spins in a subject situated in the MR scanner are prepared in a preparation region with preparation parameters and, after preparing said nuclear spins, to acquire MR image data at ultrashort echo times from a scan region of the subject, said MR image data representing an image of the scan region;

a processor provided with said MR image data, said processor being configured to access reference image data that represent a reference image of the scan region, and combining said MR image data with said reference image data to produce a resultant image; and said processor being configured to make the resultant image available in electronic form at an output of the processor, as a data file.

* * * * *